(12) United States Patent
Strasser et al.

(10) Patent No.: US 7,787,970 B2
(45) Date of Patent: Aug. 31, 2010

(54) POSITION-MEASURING DEVICE AND METHOD FOR POSITION MEASURING

(75) Inventors: Erich Strasser, Trostberg (DE); Elmar Mayer, Nussdorf (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 1058 days.

(21) Appl. No.: 11/180,014

(22) Filed: Jul. 11, 2005

(65) Prior Publication Data

US 2006/0009947 A1 Jan. 12, 2006

(30) Foreign Application Priority Data

Jul. 9, 2004 (DE) ...................... 10 2004 033 266

(51) Int. Cl.
G05B 19/18 (2006.01)
G01C 9/00 (2006.01)
G05B 19/10 (2006.01)
G05B 19/31 (2006.01)
H02P 6/00 (2006.01)
H02P 1/34 (2006.01)
G01C 21/00 (2006.01)
G01D 21/00 (2006.01)

(52) U.S. Cl. ......................... 700/56; 318/567; 318/605; 318/721; 318/823; 701/215; 702/150; 33/655

(58) Field of Classification Search .................. 700/56; 360/40; 327/571; 341/143; 356/623; 451/5; 702/150; 318/567, 721, 823, 605; 701/215; 33/655

See application file for complete search history.

(56) References Cited

U.S. PATENT DOCUMENTS 2,775,755 A * 12/1956 Sink ............................ 341/15
3,143,666 A 8/1964 Aaronson
3,622,982 A * 11/1971 Clark et al. .................. 714/783
3,878,652 A * 4/1975 Mosher ......................... 451/5
3,996,612 A 12/1976 Fassbender
4,392,195 A * 7/1983 Inoue .......................... 700/162
4,513,540 A * 4/1985 Dzewaltowski et al. ........ 451/5
4,591,770 A * 5/1986 Isobe et al. .................. 318/565
4,833,405 A * 5/1989 Richards et al. ......... 324/207.22
5,038,616 A * 8/1991 Schneider et al. ............. 73/660
5,095,447 A 3/1992 Manns et al.
5,187,417 A * 2/1993 Minnich et al. ......... 318/400.12
5,335,123 A * 8/1994 Shimizu et al. ............... 360/75
5,659,491 A * 8/1997 Ichikawa et al. ............. 702/65
5,691,814 A 11/1997 Strasser
5,748,508 A * 5/1998 Baleanu ....................... 703/13

(Continued)

FOREIGN PATENT DOCUMENTS

EP 0 707 198 4/1996

*Primary Examiner*—Albert DeCady
*Assistant Examiner*—Thomas H Stevens
(74) *Attorney, Agent, or Firm*—Kenyon & Kenyon LLP (57) ABSTRACT

A position-measuring device having integrated function testing includes a position-recording unit, a processing unit, and a control-word generator. In a positional-data request, a positional-data word is first generated in the position-recording unit and output to the processing unit. There, the position data word is processed into a position value. Subsequently, a control-data word is generated in the position-recording unit according to the specification of the control-word generator and output to the processing unit. The processing unit processes the control-data word into a control value which has a defined mathematical relationship to the position value.

18 Claims, 4 Drawing Sheets

U.S. PATENT DOCUMENTS

| | | | |
|---|---|---|---|
| 6,163,286 A | 12/2000 | Lee et al. | |
| 6,260,004 B1 * | 7/2001 | Hays et al. | 702/183 |
| 6,285,831 B1 * | 9/2001 | Hara | 396/50 |
| 6,334,181 B1 | 12/2001 | Boutaud et al. | |
| 6,607,349 B2 * | 8/2003 | Mulera et al. | 415/1 |
| 6,672,184 B2 * | 1/2004 | Ogawa et al. | 82/106 |
| 6,700,231 B2 * | 3/2004 | Takamune et al. | 310/20 |
| 6,820,511 B2 * | 11/2004 | Mutschler et al. | 73/866.5 |
| 6,871,409 B2 * | 3/2005 | Robb et al. | 33/288 |
| 7,044,830 B2 * | 5/2006 | Sakagami et al. | 451/5 |
| 7,100,354 B2 * | 9/2006 | Opper | 60/39.091 |
| 7,190,138 B2 * | 3/2007 | Kamio et al. | 318/445 |
| 2003/0014151 A1 * | 1/2003 | Nigazawa et al. | 700/186 |
| 2004/0136878 A1 * | 7/2004 | Meier et al. | 422/102 |
| 2004/0136879 A1 * | 7/2004 | Meier et al. | 422/109 |
| 2004/0247445 A1 * | 12/2004 | Nelson et al. | 417/1 |

* cited by examiner

POSITION-MEASURING DEVICE AND METHOD FOR POSITION MEASURING

CROSS-REFERENCE TO RELATED APPLICATIONS

The present application claims priority to Application No. 10 2004 033 266.5, filed in the Federal Republic of Germany on Jul. 9, 2004, which is expressly incorporated herein in its entirety by reference thereto.

FIELD OF THE INVENTION

The present invention relates to a position-measuring device with integrated function testing and to a method for position measuring in a position-measuring device having integrated function testing. In connection with every positional-data request, such a position-measuring device may make it possible to ascertain whether the transfer of the positional data into the internal memory units of the position-measuring device is functioning.

BACKGROUND INFORMATION

A large application area for position-measuring devices, particularly angular measuring devices, is numerically controlled machine tools. They are used to determine actual positional data, which the numerical control requires to control the control loops by which the feed of the tool or the workpiece is controlled. To this end, they are generally coupled to the shaft of a motor, either directly or indirectly.

Malfunctions in the positional-data recording may cause major problems. One error source may be the failure of the coupling between motor shaft and position-measuring device, which results in the position-measuring device always providing the same position value. As a consequence, not only may it happen that the workpiece just processed becomes unusable since too much material is being removed, but also that the tool machine is damaged because, for example, a tool comes into contact with a rapidly rotating spindle. Even worse than the financial damage is the injury risk for the operators.

Such a malfunction may have different causes. One cause may be a break of the mechanical connection between the position-measuring device and the motor shaft connecting the angular measuring device to the motor spindle. Such a mechanical shaft failure leads to a standstill of the shaft of the position-measuring device, and the measured-position value no longer changes although the motor shaft is rotating.

An additional cause may be a failure in the electronic evaluation of the positional data in the position-measuring device, e.g., a malfunction in the transfer of the positional data into an intermediate memory. If, for example, there is a line failure in the control line that controls the storing of the positional data in the intermediate memory, the positional data stored in the intermediate memory no longer changes, so that the same position value is output over and over. Such a defect is also referred to as electronic shaft break or failure.

Both a mechanical and an electronic shaft failure are able to be detected in the numerical control during the positioning process in a rapid and reliable manner. This is not possible while a shaft is at a standstill, i.e., when an axle is to be held in a particular position. The reason is that the numerical control is unable to distinguish whether the drive of an axle does indeed not move or whether it is only the position value that does no longer change.

While a mechanical shaft failure during standstill, i.e., without a force acting on the shaft of the angular measuring device, is to be considered unlikely, an electronic shaft failure may occur independently of the feed movement. To detect an electronic shaft failure, conventional position-measuring devices often transmit analog track signals in addition to the digitally encoded position values. These are sin/cos signals which are generated according to the conventional principle of incremental position measuring. When evaluating the positional data in the numerical control, it is checked whether both the digital and the analog position values change. If this is not the case, for example, if the digitally encoded position values remain constant whereas the analog signals continue to change, the control recognizes the defect and is able to initiate appropriate measures.

The increased effort that may be required for the additional generation, transmission and evaluation of the analog signals is considered to be a disadvantage. This disadvantage may become even greater by the attempts to use only purely digital interfaces between the position-measuring devices and the numerical control.

SUMMARY

An example embodiment of the present invention may provide a position-measuring device having integrated function testing by which an electronic shaft failure is able to be detected without analog track signals, at a standstill as well.

Furthermore, an example embodiment of the present invention may provide a method for position measuring by which an electronic shaft failure is able to be detected without analog track signals, at a standstill as well.

A position-measuring device having integrated functional testing may include a position-recording unit, a processing unit and a control-word generator. In response to a positional-data request, a positional-data word is first generated in the position-recording unit and output to the processing unit. There, the positional-data word is processed into a position value. Subsequently, a control-data word is generated in the position-recording unit according to the specification of the control-word generator and output to the processing unit. The processing unit processes the control-data word into a control value which has a defined mathematical relationship to the position value.

According to an example embodiment of the present invention, a position-measurement device including integrated function testing includes: a position-recording unit; a processor unit, the position-recording unit connected to the processor unit; and a control-word generator. The position-recording unit is configured to generate a positional-data word, including an instantaneous position value, and a control-data word, and the positional-data word and the control-data word are outputtable to the processing unit. The processor unit is configured to generate a position value from the positional-data word and a control value from the control-data word, and the control value and the position value have a defined mathematical relationship to one another. The control-word generator is configured to adjust whether the positional-data word or the control-data word is output by the position-recording unit.

The position-measurement device may include: a result memory configured to store the position value; and a control-value memory configured to store the control value.

The position-measurement device may include an interface unit configured to transmit contents of the result memory and the control-value memory to sequential electronics via a data-transmission line.

The position-recording unit may be configured to overwrite the positional-data word with the control-data word.

The position-recording unit may include a voltage-current transformer and at least one current node configured to overwrite the positional-data word with the control-data word.

The position-measurement device may include an arrangement configured to force an invalid position value in the position-recording unit.

The arrangement may include a switch line between a sensor element of the position-recording unit and the control-word generator, and the sensor element may be deactivatable via the switch line.

According to an example embodiment of the present invention, a method for position-measurement in a position-measurement device including integrated function testing, the position-measurement device including a position-recording unit, a processor unit and a control-word generator, includes: generating a positional-data word in the position-recording unit; outputting the positional-data word to the processing unit; processing the positional-data word into a position value in the processor unit; generating a control-data word in the position-recording unit as specified by the control-word generator; outputting the control-data word to the processing unit; and processing the control-data word in the processing unit into a control value that has a defined mathematical relationship to the position value.

The method may include: storing the position value in a result memory; and storing the control value in a control-value memory.

The method may include transmitting the position value stored in the result memory and the control value stored in the control-value memory from an interface unit to sequential electronics via a signal transmission line.

The method may include overwriting the positional-data word by the control-data word in the position-recording unit.

The control-data word may be generated in the control-data word generating step by forcing an invalid position value by the control-word generator in the position-recording unit.

The invalid position value may be forced by deactivating a sensing element in the position-recording unit via a switch line.

The control-data word processing step may include adding an offset value to a previously ascertained position value to generate the control value if the control-data word does not include any valid position value.

Additional aspects and features of example embodiments of the present invention are described below with reference to the appended Figures.

DETAILED DESCRIPTION

Figure 1:
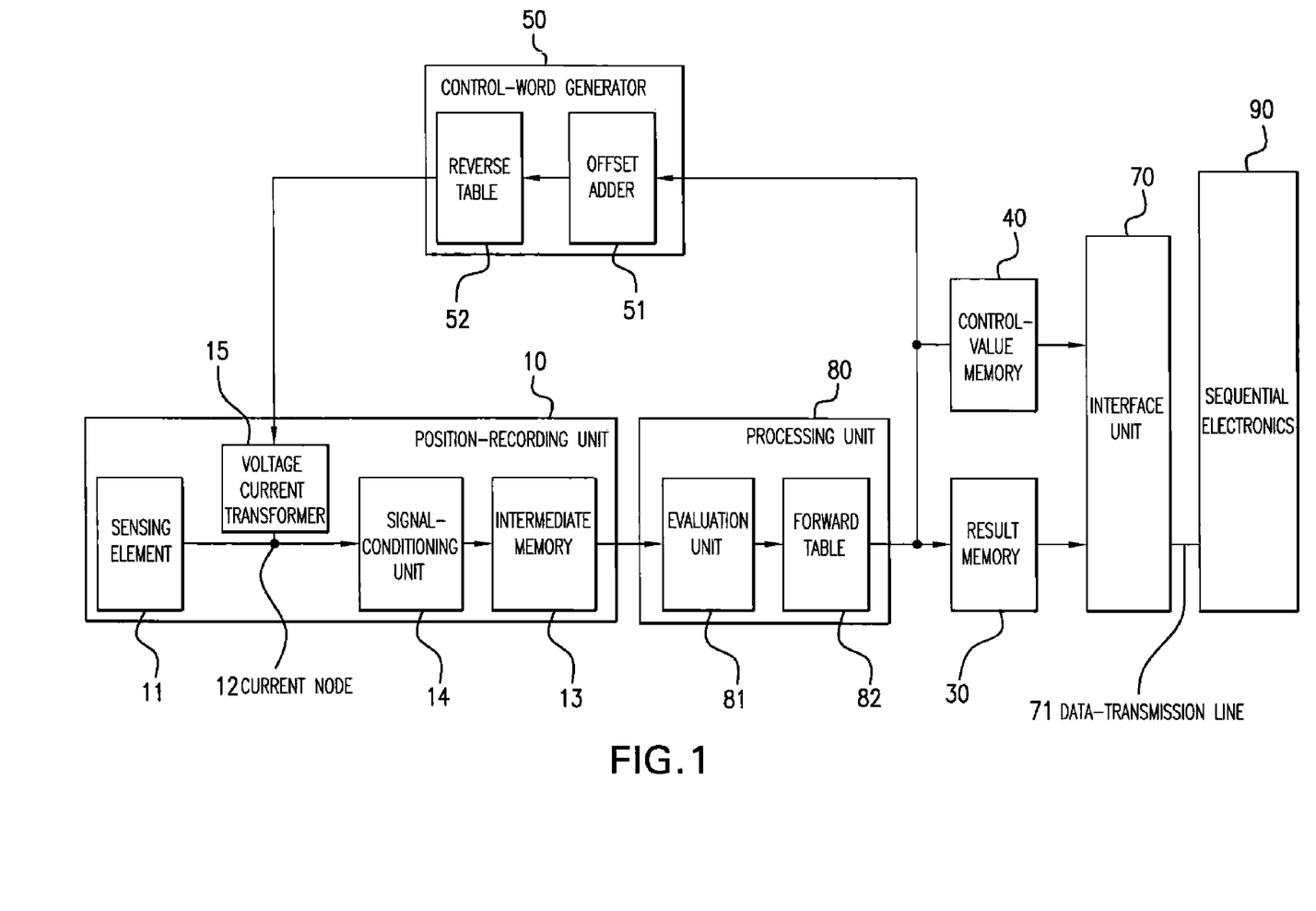
FIG. 1 is a block diagram of a position-measuring device according to an example embodiment of the present invention.

FIG. 1 is a block diagram of a position-measuring device according to an example embodiment of the present invention. The position-measuring device includes a position-recording unit 10, a result memory 30, a control-word memory 40, a control-word generator 50, an interface unit 70 as well as a processing unit 80.

In position-recording unit 10, a positional-data word having a width of at least one bit is generated. The positional-data word may be encoded as desired and have any desired degree of redundancy. Furthermore, it may include supplementary information that allows identification of valid bits for the position value in the subsequent evaluation, for example.

Position-recording unit 10 of the position-measuring device illustrated in FIG. 1 includes a sensing element 11, at least one current node 12, an intermediate memory 13, a signal-conditioning unit 14, and a voltage-current transformer 15.

The generation of the positional-data word in sensing element 11 may be based, for example, on conventional, e.g., optical scanning principles. In the process, light that is radiated by a light source to a number of photo detectors, is modulated via a measuring graduation which is arranged in a displaceable manner in the optical path of the light, the modulation being implemented when the measuring graduation is moved relative to the light source and the photo detectors. Depending on whether it is a rotary or linear position-measuring device, the measuring graduation is applied on a circular graduation disk or a ruler. The measuring graduation may include one or a plurality of tracks with regions that have different optical characteristics, such as transparent/opaque or reflective/non-reflective. The output signals of sensing element 11 are analog current signals, the output current of which changes as a function of the illuminance. Each bit of the positional-data word generated in this manner is thus represented by an analog current signal.

Control-word generator 50 may specify a control-data word for position-recording unit 10. The individual bits of the control-data word are converted into current signals in a voltage-current transformer 15, the current signals being linked to the associated bits of the positional-data word via current nodes 12. The amplitude of the current signals is set such that the particular sum current signals at current nodes 12 are dominated by the current signals of the control-data word. In other words, the positional-data word at the output of sensing element 11 is overwritten by the control-data word. Current nodes 12 and voltage-current transformer 15 thus represent an arrangement by which it may be adjusted whether position-recording unit 10 outputs the positional-data word or the control-data word.

The sum-current signals of current nodes 12 are transmitted to signal-conditioning unit 14 where they are converted into digital voltage signals which form a data word that is forwarded to intermediate memory 13 where it is able to be stored. The data word stored in intermediate memory 13 may therefore be the positional-data word or the control-data word.

The example embodiment of a position-measuring device described relates to a sensing element 11, the output signals of which include current signals. However, the functional principle of overwriting the positional-data word with the control-data word may be utilized—with slight modifications—even when the output signals of sensing element 11 are voltage signals.

The content of intermediate memory 13 forms the output of position-recording unit 10 which is connected to processing unit 80. Regardless of whether the data word output by position-recording unit 10 is a positional-data word or a control-data word, processing unit 80 processes the data word in the same manner. If it is the positional-data word, the result at the output of processing unit 80 corresponds to the position value. In contrast, if it is the control-data word, the result corresponds to the control value. The output of processing unit 80 is forwarded to result memory 30, control-value memory 40, and control-word generator 50.

Processing unit 80 includes an evaluation unit 81 and a forward table 82 to process the data word. Evaluation unit 81 is used to check the validity of the positional-data word and to extract an encoded position value from the information contained in the positional-data word. This position value is decoded via forward table 82 and output via the output of processing unit 80.

Control-word generator 50 includes an offset adder 51 to add an offset value K to the decoded position value at the output of processing unit 80. The resulting data word is encoded by a reverse table 52 and brought into a form that corresponds to the form of the positional information in the position-data word. If control-word generator 50 outputs the control word thus created to position-recording unit 10, the actual positional-data word is overwritten in position-recording unit 10 at the output of the sensing element and the control-data word is output instead.

The position value stored in result memory 30 and the control value stored in control-value memory 40 are forwarded to interface unit 70 and are able to be transmitted to a sequential electronics 90 by data-transmission line 71.

By forming the difference between the control value and the position value and by comparing the result to known offset value K in the sequential electronics, it is possible to ascertain whether the control value and position value were generated and transmitted without errors.

As an alternative, the evaluation by subtraction and the comparison may already be implemented in the position-measuring device as well. In this circumstance, it may suffice to transmit only the position value and the result of the evaluation to sequential electronics 90, for example, by a status bit. The data quantity to be transmitted may be reduced in this manner. However, the afore-described variant may provide for additionally checking the error-free transmission via interface unit 70 and data-transmission line 71.

Interface unit 70 may be a serial interface.

Figure 2:
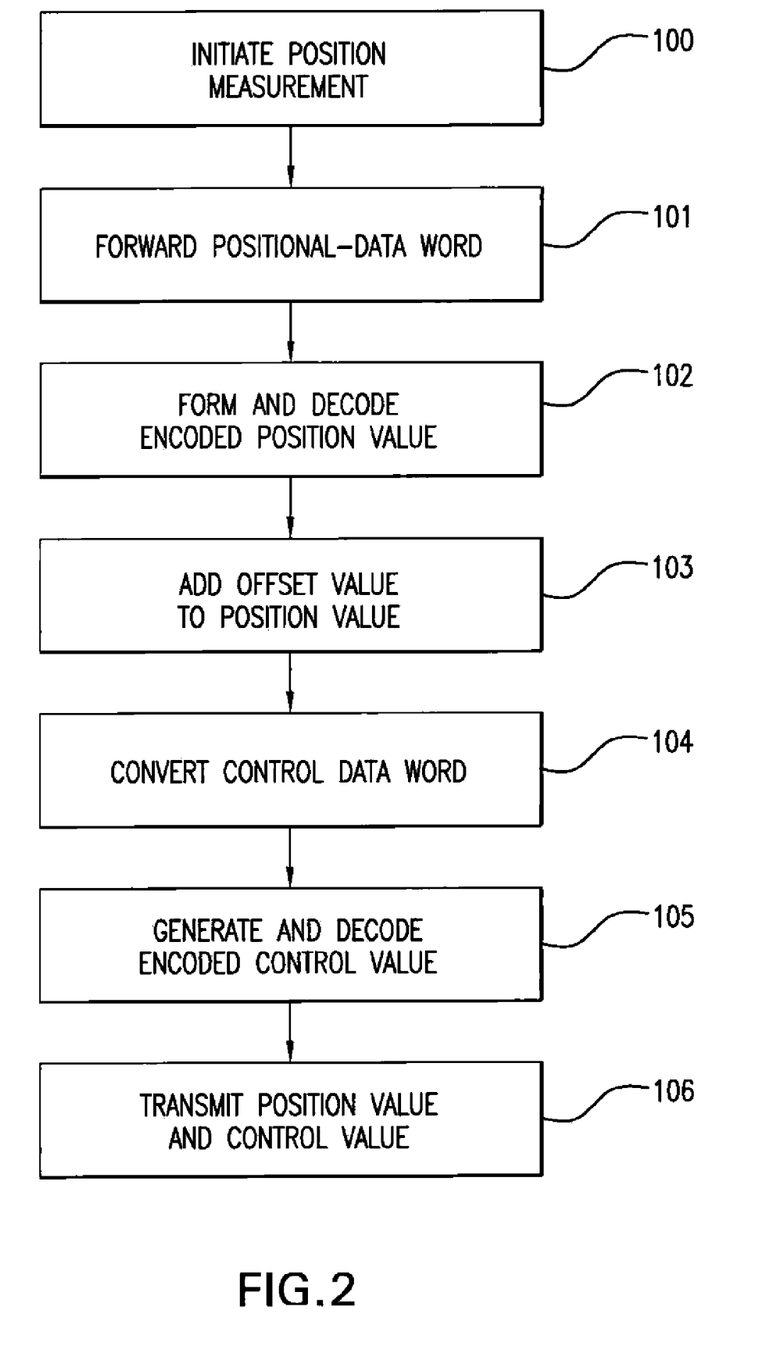
FIG. 2 is a flow chart of a method for positional-data recording by a position-measuring device such as that illustrated in FIG. 1.

The flow chart in FIG. 2 illustrates the method for positional-data recording in a position-measuring device such as that illustrated in FIG. 1.

In step 100, a position measurement is initiated, for example, by a signal edge on data-transmission line 71, and a positional-data recording is started.

In step 101, position-recording unit 10 forwards the positional-data word presently available at the output of sensing element 11 via current nodes 12 to signal-conditioning unit 14 where the analog current signals are converted into digital voltage signals. These form a data word that is forwarded to intermediate memory 13 and stored there. The content of intermediate memory 13 is output at the output of position-recording unit 10.

In step 102, in processing unit 80, an encoded position value is first formed in evaluation unit 81 from the content of intermediate memory 13 and subsequently decoded with the aid of forward table 82. The position value thus derived from the content of intermediate memory 13 is stored in result memory 30 and supplied to control-word generator 50. Via the output of result memory 30, the position value is also available to interface unit 70.

In step 103, in offset adder 51 of control-word generator 50, offset value K is added to the position value derived from the content of intermediate memory 13, and the resulting data word is encoded via reverse table 52. The control-data word created in this manner is output to position-recording unit 10.

In step 104, in position-recording unit 10, the bits of this control-data word are converted into current signals in voltage-current converter 15, the current signals overwriting the current positional-data word at current nodes 12. The sum-current signals of current nodes 12 are reconverted into voltage signals in signal-conditioning unit 14 and stored in intermediate memory 13. The content of intermediate memory 13 now corresponds to the control-data word and is output at the output of position-recording unit 10.

In step 105, an encoded control value is first generated in processing unit 80 from the control-data word and subsequently decoded with the aid of forward table 82. The control value thus derived from the control-data word is stored in control-value memory 40 and output to interface unit 70 via the output of control-value memory 40.

In step 106, the position value and the control value are transmitted to sequential electronics 90 via interface unit 70 and data-transmission line 71. There, inferences regarding the functioning of the position-measuring device may be drawn via the known mathematical relationship that exists between the two values. This may be done, for example, by forming the difference between the position value and the control value and comparing the result with the expected offset value K. For example, the fault-free transfer of the positional-data word or the control-data word into intermediate memory 13 and the storing of the position value in result memory 30 and of the control value in control-value memory 40 are able to be checked in this manner. Since the evaluation takes place in the sequential electronics, the fault-free transmission of the data to sequential electronics 90 is automatically checked as well.

Figure 3:
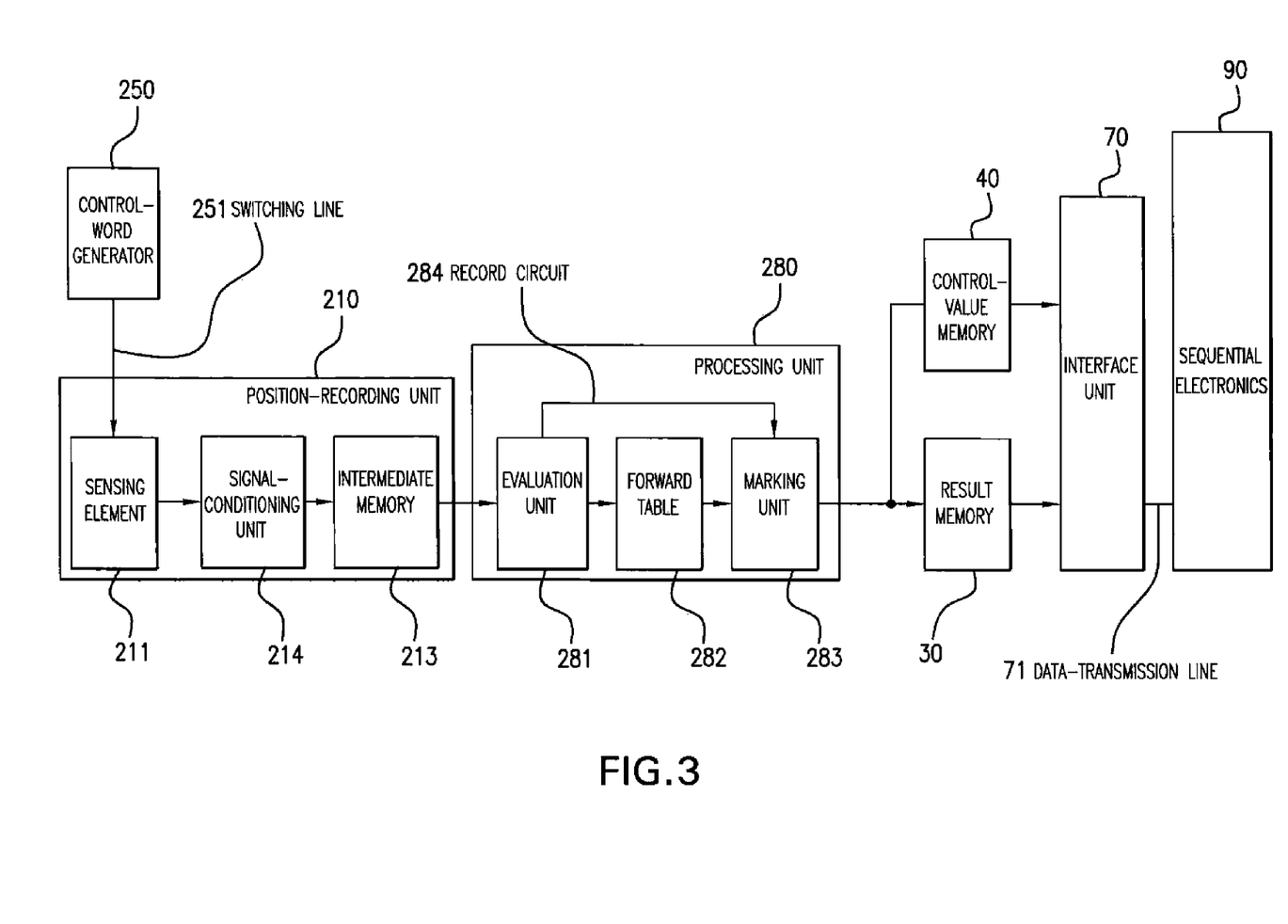
FIG. 3 is a block diagram of a position-measuring device according to an example embodiment of the present invention.

FIG. 3 is a block diagram of a position-measuring device according to an example embodiment of the present invention. The position-measuring device includes a position-recording unit 210, a result memory 30, a control-value memory 40, a control-word generator 250, an interface unit 70, and a processing unit 280. Components that have the same or similar function as those illustrated in FIG. 1 have been provided with matching reference numerals and are not discussed further.

Position-recording unit 210 operates according to the above-described optical scanning principle. As in FIG. 1, a positional-data word having a width of at least one bit is generated in sensing element 211, the data word including current signals which are converted into voltage signals in a signal-conditioning unit 214 and are able to be stored in an intermediate memory 213.

A switching line 251 via which sensing element 251 is able to be deactivated extends from sensing element 211 to control-word generator 250. Such deactivation may be implemented, for example, by switching off a light source which is located in sensing element 211 according to the sampling principle. Another possibility is that switching line 251 deactivates photo detectors which are included in sensing element 211. Depending on the method of functioning of sensing element 211, other measures may be provided for its deactivation.

In the deactivated state, sensing element 211 generates a control-data word in which all bits have a logical low-level. This control-data word is clearly differentiable from a positional-data word since it does not include a valid position value. Switching line 251 thus constitutes an arrangement by which it may be adjusted whether a positional-data word or a control-data word is output at the output of position-recording unit 210.

Processing unit 280 is used to process the positional-data word into a position value and the control-data word into a control value, the position value and the control value having a defined mathematical interrelationship. Processing unit 280 includes an evaluation unit 281, a forward table 282, a marking unit 283, as well as a record circuit 284.

In evaluation unit 281, it is checked whether the data word at the input of processing unit 280 is a valid data word, i.e., whether it includes an encoded position value. The result of the check is reported to marking unit 283 via a record circuit 284.

A valid data word is used in evaluation unit 281 to generate an encoded position value, which is transmitted to forward table 282 where it is decoded into a position value. This position value is forwarded, in unchanged form, through marking unit 283 and is output at the output of processing unit 280.

If it is signaled to marking unit 283 via record circuit 284 that an invalid data word is involved, marking unit 283 will add an offset value K to the most recently ascertained position value, which is still available at this point, and outputs the result at the output of processing unit 280 as control value.

By evaluation unit 281, forward table 282, marking unit 283 and record circuit 284, processing unit 280 thus has an arrangement at its disposal to process the positional-data word into a position value and the control-data word into a control value.

Figure 4:
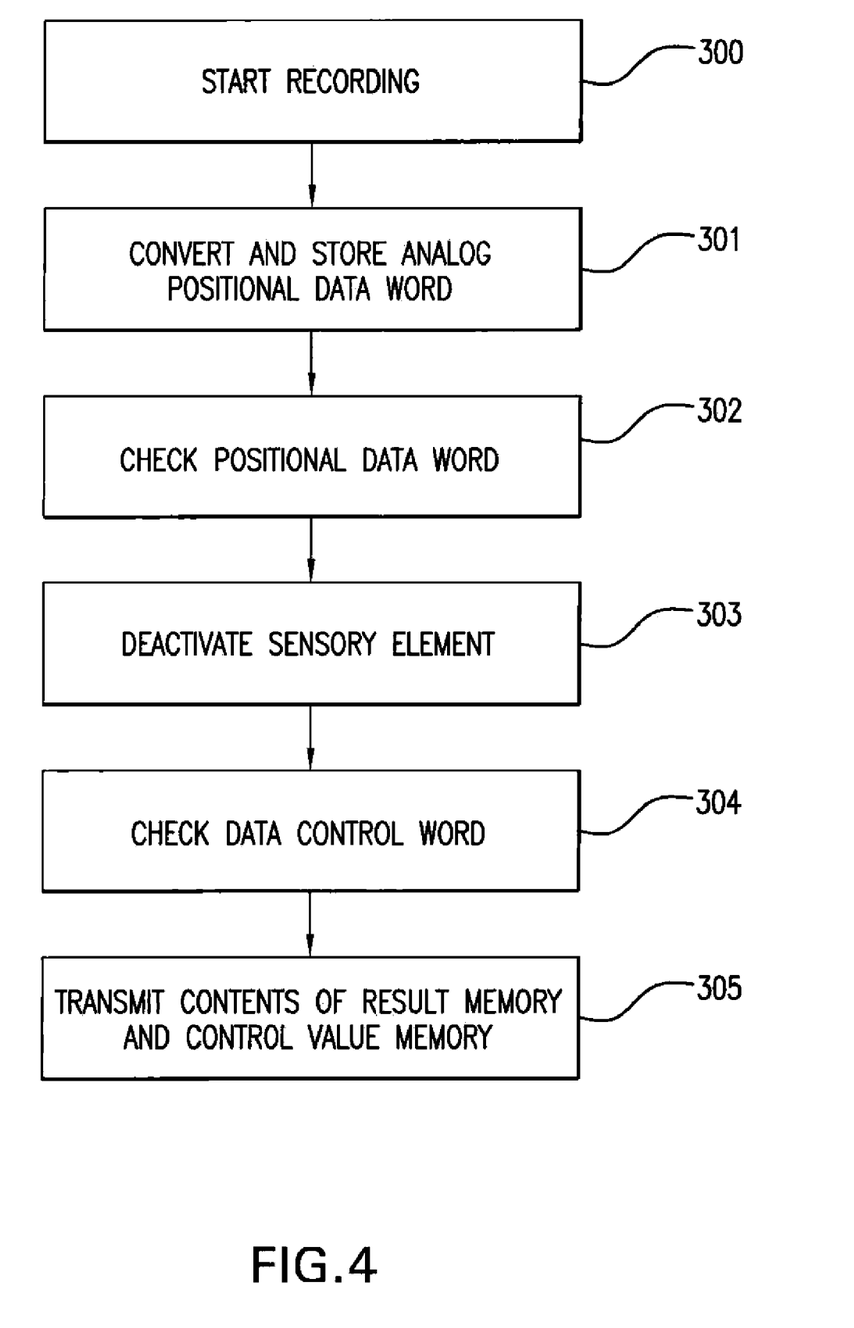
FIG. 4 is a flow chart of a method for positional-data recording by a position-measuring device such as that illustrated in FIG. 3.

The flow chart in FIG. 4 illustrates a method for positional-data recording in a position-measuring device such as that illustrated in FIG. 3.

In step 300, a positional-data recording is started.

In step 301, the analog positional-data word that at this time is output at the output of sensing element 211 in the form of at least one current signal, is converted into a digital positional-data word in signal-conditioning unit 214 and stored in intermediate memory 213. The content of intermediate memory 213 is output at the output of position-recording unit 210.

In processing unit 280, in step 302, the arriving positional-data word is initially checked for validity in evaluation unit 281, and the result of the check test is transmitted to marking unit 283 via record circuit 284. Since the position-data word is an actually measured value, the result of the check is positive. Therefore, evaluation unit 281 forms an encoded position value from the positional-data word and transmits it to forward table 282 where it is decoded into a position value. Since a valid position value is signaled to marking unit 283 via record circuit 284, this position value is output in unchanged form at the output of processing unit 280 and stored in result memory 30.

In step 303, control-word generator 250 deactivates sensing element 211 via switching line 251. Regardless of the actual positional-data word, sensing element 211 outputs an analog control-data word in which all bits have a logical low-level. This analog control-data word is converted into a digital control-data word in signal-conditioning unit 214 and stored in intermediate memory 213.

In step 304, evaluation unit 281 in processing unit 280 first checks the control-data word for validity. Evaluation unit 281 detects the control-data word as invalid when it does not contain a valid position value and informs marking circuit 283 of this result via record circuit 284. Marking unit 283 thereupon adds an offset value K to the most recent position value generated in step 301 in this example, and outputs the control value thus generated at the output of processing unit 280. In this manner, the control value has a defined mathematical relationship to the position value and is stored in control-value memory 40.

In step 305, the contents of result memory 30 and control-value memory 40 are transmitted to a sequential electronics 90 via interface unit 70 and data-transmission line 71. There, as described above, it is possible to draw inferences regarding the functioning of the position-measuring device, e.g., concerning the fault-free transfer of the internal data into intermediate memory 213, result memory 30, and control-value memory 40, via the known mathematical interrelationship existing between the two values.

The described example embodiments of a position-measuring device having integrated function testing and the method for position measuring may of course be modified within the spirit and scope hereof and may be adapted to various requirements.

What is claimed is:

1. A position-measurement device including integrated function testing, comprising:
   a position-recording unit;
   a processor unit, the position-recording unit connected to the processor unit; and
   a control-word generator;
   wherein the position-recording unit is configured to generate a positional-data word, including an instantaneous position value, and a control-data word, the positional-data word and the control-data word outputtable to the processor unit, the processor unit configured to generate a position value from the positional-data word and a control value from the control-data word, the control value and the position value having a defined mathematical relationship to one another, the control-word generator configured to adjust whether the positional-data word or the control-data word is output by the position-recording unit.

2. The position-measurement device according to claim 1, further comprising:
   a result memory configured to store the position value; and
   a control-value memory configured to store the control value.

3. The position-measurement device according to claim 2, further comprising an interface unit configured to transmit contents of the result memory and the control-value memory to sequential electronics via a data-transmission line.

4. The position-measurement device according to claim 1, wherein the position-recording unit is configured to overwrite the positional-data word with the control-data word.

5. The position-measurement device according to claim 4, wherein the position-recording unit includes a voltage-current transformer and at least one current node configured to overwrite the positional-data word with the control-data word.

6. The position-measurement device according to claim 1, further comprising an arrangement configured to force an invalid position value in the position-recording unit.

7. A position-measurement device including integrated function testing, comprising:
   a position-recording unit;
   a processor unit, the position-recording unit connected to the processor unit;
   a control-word generator; and
   an arrangement configured to force an invalid position value in the position-recording unit;
   wherein the position-recording unit is configured to generate a positional-data word, including an instantaneous position value, and a control-data word, the positional-data word and the control-data word outputtable to the processing unit, the processor unit configured to generate a position value from the positional-data word and a control value from the control-data word, the control value and the position value having a defined mathematical relationship to one another, the control-word generator configured to adjust whether the positional-data word or the control-data word is output by the position-recording unit; and wherein the arrangement includes a switch line between a sensor element of the position-recording unit and the control-word generator, the sensor element deactivatable via the switch line.

8. A method for position-measurement in a position-measurement device including integrated function testing, the position-measurement device including a position-recording unit, a processor unit and a control-word generator, comprising:

generating a positional-data word in the position-recording unit;
outputting the positional-data word to the processor unit;
processing the positional-data word into a position value in the processor unit;
generating a control-data word in the position-recording unit as specified by the control-word generator;
outputting the control-data word to the processor unit; and
processing the control-data word in the processor unit into a control value that has a defined mathematical relationship to the position value.

9. The method according to claim 8, further comprising:
storing the position value in a result memory; and
storing the control value in a control-value memory.

10. The method according to claim 9, further comprising transmitting the position value stored in the result memory and the control value stored in the control-value memory from an interface unit to sequential electronics via a signal transmission line.

11. The method according to claim 8, further comprising overwriting the positional-data word by the control-data word in the position-recording unit.

12. A method for position-measurement in a position-measurement device including integrated function testing, the position-measurement device including a position-recording unit, a processor unit and a control-word generator, comprising:

generating a positional-data word in the position-recording unit;
outputting the positional-data word to the processor unit;
processing the positional-data word into a position value in the processor unit;
generating a control-data word in the position-recording unit as specified by the control-word generator;
outputting the control-data word to the processor unit; and
processing the control-data word in the processor unit into a control value that has a defined mathematical relationship to the position value;
wherein the control-data word is generated in the control-data word generating step by forcing an invalid position value by the control-word generator in the position-recording unit.

13. The method according to claim 12, wherein the invalid position value is forced by deactivating a sensing element in the position-recording unit via a switch line.

14. The method according to claim 12, wherein the control-data word processing step includes adding an offset value to a previously ascertained position value to generate the control value if the control-data word does not include any valid position value.

15. The position-measurement device according to claim 1, wherein the position-measurement device is adapted to measure a relative position between two objects, the instantaneous position value representing an instantaneous relative position between the two objects.

16. The position-measurement device according to claim 1, wherein the position-measurement device is adapted to measure a relative angular position between two objects, the instantaneous position value representing an instantaneous relative angular position between the two objects.

17. The method according to claim 8, wherein the position-measurement device is adapted to measure a relative position between two objects, the position value representing a relative position between the two objects.

18. The method according to claim 8, wherein the position-measurement device is adapted to measure a relative angular position between two objects, the position value representing a relative angular position between the two objects.

* * * * *